United States Patent
Yoshida

(10) Patent No.: US 8,004,809 B2
(45) Date of Patent: Aug. 23, 2011

(54) SEMICONDUCTOR INTEGRATED CIRCUIT DEVICE HAVING OVERCURRENT LIMITATION CIRCUIT

(75) Inventor: Mitsuru Yoshida, Shiga (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 161 days.

(21) Appl. No.: 12/382,479

(22) Filed: Mar. 17, 2009

(65) Prior Publication Data

US 2009/0237851 A1  Sep. 24, 2009

(30) Foreign Application Priority Data

Mar. 19, 2008  (JP) ................................. 2008-071908

(51) Int. Cl.
*H02H 5/04* (2006.01)
(52) U.S. Cl. ....................... 361/93.9; 361/103
(58) Field of Classification Search ........ 361/93.7–93.9, 361/103
See application file for complete search history.

(56) References Cited

U.S. PATENT DOCUMENTS

| 5,303,110 | A  | * | 4/1994 | Kumagai ........................ 361/18 |
| 6,538,480 | B2 | * | 3/2003 | Takada et al. ................. 327/108 |
| 7,012,792 | B2 |   | 3/2006 | Yoshida |
| 7,158,359 | B2 | * | 1/2007 | Bertele et al. ................ 361/93.9 |
| 2003/0117758 | A1 | | 6/2003 | Yoshida |

FOREIGN PATENT DOCUMENTS

JP  2003-197913  7/2003

* cited by examiner

*Primary Examiner* — Danny Nguyen

(74) *Attorney, Agent, or Firm* — McGinn IP Law Group, PLLC

(57) ABSTRACT

A semiconductor integrated circuit device includes an output transistor, an overcurrent detection circuit and overcurrent limitation circuit. The overcurrent detection circuit includes a first transistor detecting an overcurrent of the output transistor. The overcurrent limitation circuit is connected between a gate and a source of the output transistor. The overcurrent limitation circuit includes a plurality of resistance elements and a diode connected in series between the gate and the source of the output transistor in series, and a second transistor whose gate is connected to a connection point between the resistance elements and that is cascade connected to the first transistor.

7 Claims, 3 Drawing Sheets

SEMICONDUCTOR INTEGRATED CIRCUIT DEVICE HAVING OVERCURRENT LIMITATION CIRCUIT

BACKGROUND OF THE INVENTION

1. Field of the Invention

The present invention relates to a semiconductor integrated circuit device, and in particular to the semiconductor integrated circuit device including an overcurrent limitation circuit having an output voltage that varies according to a variation of a threshold value voltage of an MOS transistor for outputting.

2. Description of Related Art

FIG. 3 shows a circuit diagram illustrating a conventional semiconductor integrated circuit device described in a Patent Document 1 (Japanese Patent Publication Laid-Open No. 2003-197913), which discloses a semiconductor integrated circuit device including an overcurrent limitation circuit.

In FIG. 3, the semiconductor integrated circuit 100 includes an NMOS transistor M1 for outputting formed on a silicon substrate, an overcurrent detection circuit 105 for detecting an overcurrent of the NMOS transistor M1, and an overcurrent limitation circuit 102 that is connected between a gate electrode terminal and a source electrode terminal of the NMOS transistor M1, controls a detected current of the overcurrent detection circuit 105, and has an output voltage that varies according to a variation of a threshold value voltage of the MOS transistor M1. The NMOS transistor M1 connects a gate thereof to an input terminal IN via a resistance element R5 and turns on/off a current of a load 101 whose one end is connected to a power supply VDD according to a control voltage of the input terminal IN.

The overcurrent detection circuit 105 includes resistance elements R3 and R4 that are connected to each other in series for detecting a voltage between a drain terminal and a source terminal of the NMOS transistor M1, and an NMOS transistor M2 for detecting an overcurrent whose gate electrode is connected to a connection point between the resistance elements R3 and R4.

A overcurrent limitation circuit 102 includes a resistance elements R1 and R2 for determining a gate voltage of the NMOS transistor M1 to restrict the overcurrent of the overcurrent detection circuit 105, and an NMOS transistor M3 including a dispersing layer formed in a same process as a base dispersing layer for determining a threshold value voltage of the NMOS transistor M1.

Such an overcurrent limitation circuit 102 functions as a circuit causing a control voltage to vary according to the variation of the threshold value of the NMOS transistor M1. And the overcurrent limitation circuit 102 decreases a variation of a current control value even if the threshold value of the NMOS transistor M1 varies. A gate control voltage Vg of the NMOS transistor M1 when the current is restricted is represented by an expression (1) as below, where Vt denotes a threshold value of the NMOS transistor M3, $R_1$ denotes a resistance value of the resistance element R1, and $R_2$ denotes a resistance value of the resistance element R2.

$$Vg = (R_1 + R_2)/R_2 \times Vt \qquad (1)$$
$$= (1 + R_1/R_2) \times Vt$$

As illustrated by the expression (1), the threshold value voltage Vt of the NMOS transistor M3 works together with the gate control voltage Vg of the NMOS transistor M1 when the current is controlled so that a variation of the current limitation value can be decreased.

SUMMARY

Analysis described below can be realized by the present invention.

Incidentally, in recent years, particularly for vehicle installation, since an enlargement of a range for a working temperature of a semiconductor integrated circuit device has been in a great demand, it has become necessary to inhibit a variation of a current control value over a wide range of a temperature. By conventional circuits, a certain effect has been obtained for inhibiting a variation of a threshold value voltage. However, in order to address further characteristics demanded by customers, a state necessary to consider temperature dependency has been created.

In FIG. 3, a threshold value voltage Vt of the NMOS transistor M3 has a temperature coefficient about −2 mV/° C., and a gate control voltage Vg of the NMOS transistor M1 has an effect of a temperature variation of the threshold value voltage Vt of the NMOS transistor M3. For example, defining as $R_1 = R_2 = 100$ kΩ Vt=1.7 V at 25° C., by an expression (1), $$Vg = (R_1 + R_2)/R_1 \times Vt$$
$$= (100\ k\Omega + 100\ k\Omega)/100\ k\Omega \times 1.7\ V = 3.40\ V$$

at −40° C., $$Vg=(100\ k\Omega+100\ k\Omega)/100\ k\Omega\times(1.7\ V+(0.002\ V\times65°\ C.))V=3.66\ V$$

at 150° C., $$Vg=(100\ k\Omega+100\ k\Omega)/100\ k\Omega\times(1.7\ V+(0.002\ V\times125°\ C.))V=2.90\ V$$

To a temperature variation of the gate control voltage Vg of the NMOS transistor M1 as described above, as illustrated in FIG. 2(A), from characteristics of "gate voltage (VGS)-drain current (ID)" of the NMOS transistor M1, the current limitation value IDlim for the drain current increases the temperature dependency thereof having a variation about 3.0 to 7.0 A at a temperature range of −40 to 15° C.

A semiconductor integrated circuit device according to one aspect of the present invention includes an output field effect transistor formed on a main surface of a semiconductor substrate, an overcurrent detection circuit for detecting an overcurrent of the output field effect transistor, and an overcurrent limitation circuit that is connected between a gate electrode terminal and a source electrode terminal of the output field effect transistor, controls a detected current of the overcurrent detection circuit, and has an output voltage that varies according to a variation of a threshold value voltage of the output field effect transistor, the overcurrent detection circuit including a third resistance element and a fourth resistance element that detect the overcurrent of the output field effect transistor and are connected to each other in series, and a second field effect transistor whose gate electrode is connected to a connection point between the third resistance element and the fourth resistance element, the overcurrent limitation circuit including a first resistance element and a series circuit that are connected between the gate electrode terminal and the source electrode terminal of the output field effect transistor and are connected to each other in series, and a third field effect transistor whose gate electrode is connected to a connection point between the first resistance element and the series circuit and that is cascade connected to the second field effect transistor between the gate electrode terminal and the source electrode terminal of the output field effect transistor, and the series circuit including a second resistance element and "N" diodes ("N" is an integer of one or more) that is to be in a forward direction connected in a series form.

According to the present invention, a variation of a current limitation value of an output field effect transistor can be inhibited and a temperature dependency of the current limitation value can be decreased.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Figure 1:
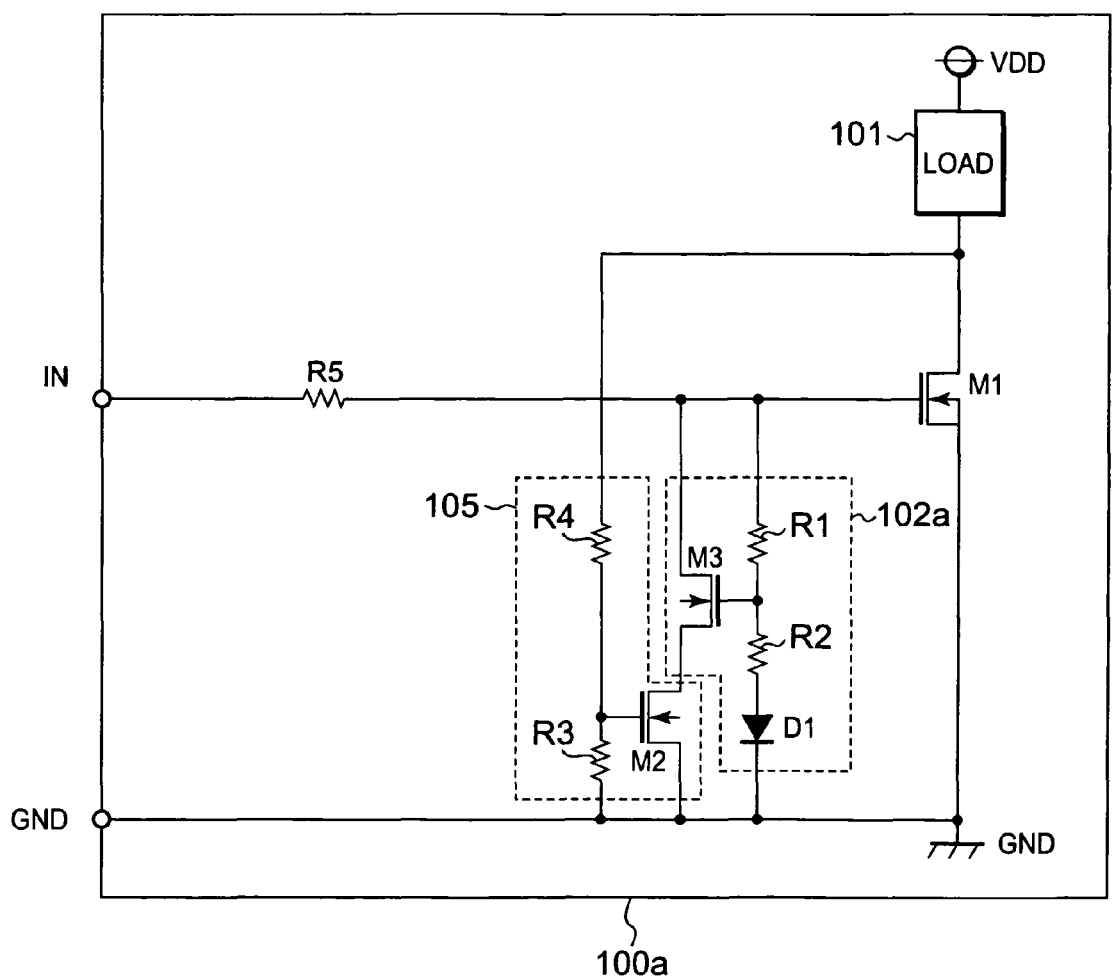
FIG. 1 is a circuit diagram illustrating a semiconductor integrated circuit device according to an exemplary embodiment of the present invention.

A semiconductor integrated circuit device according to an exemplary embodiment of the present invention includes an output field effect transistor (M1 in FIG. 1) formed on a main surface of a semiconductor substrate. The device further includes an overcurrent detection circuit (105 in FIG. 1) for detecting an overcurrent of the output field effect transistor. The device further includes an overcurrent limitation circuit (102a in FIG. 1) that is connected between a gate electrode terminal and a source electrode terminal of the output field effect transistor, controls a detected current of the overcurrent detection circuit and has an output voltage that varies according to a variation of a threshold value voltage of the output field effect transistor. The overcurrent detection circuit includes a third resistance element (R3 in FIG. 1) and a fourth resistance element (R4 in FIG. 1) that detect the overcurrent of the output field effect transistor and are connected to each other in series. The overcurrent detection circuit includes a second field effect transistor (M2 in FIG. 1) whose gate electrode is connected to a connection point between the third resistance element and the fourth resistance element. The overcurrent limitation circuit includes a first resistance element (R1 in FIG. 1) and a series circuit that are connected between the gate electrode terminal and the source electrode terminal of the output field effect transistor and are connected to each other in series. The overcurrent limitation circuit includes a third field effect transistor (M3 in FIG. 1) whose gate electrode is connected to a connection point between the first resistance element and the series circuit and that is cascade connected to the second field effect transistor between the gate electrode terminal and the source electrode terminal of the output field effect transistor. The overcurrent limitation circuit includes the series circuit includes a second resistance element (R2 in FIG. 1) and "N" diodes ("N" is an integer of one or more) (D1 in FIG. 1) that is to be in a forward direction connected in a series form.

In a semiconductor integrated circuit device according to the exemplary embodiment of the present invention, it is preferred that "N" is 1. It is preferred that the output field effect transistor, and the second and third field effect transistors are n-type field effect transistors, and one end of the second resistance element is connected to the gate electrode of the third field effect transistor, the other end thereof is connected to an anode of the diode, and a cathode of the diode is connected to the source electrode of the second field effect transistor.

According to the exemplary embodiment of the present invention, the variation of the current limitation value of the output field effect transistor can be inhibited. Further, since the temperature coefficient for decreasing the voltage in the forward direction of the diode and the temperature coefficient of the threshold value voltage of the third field effect transistor function to offset each other, the temperature dependency of the variation of the current limitation value for the output field effect transistor can be decreased.

Exemplary Embodiment 1

Figure 3:
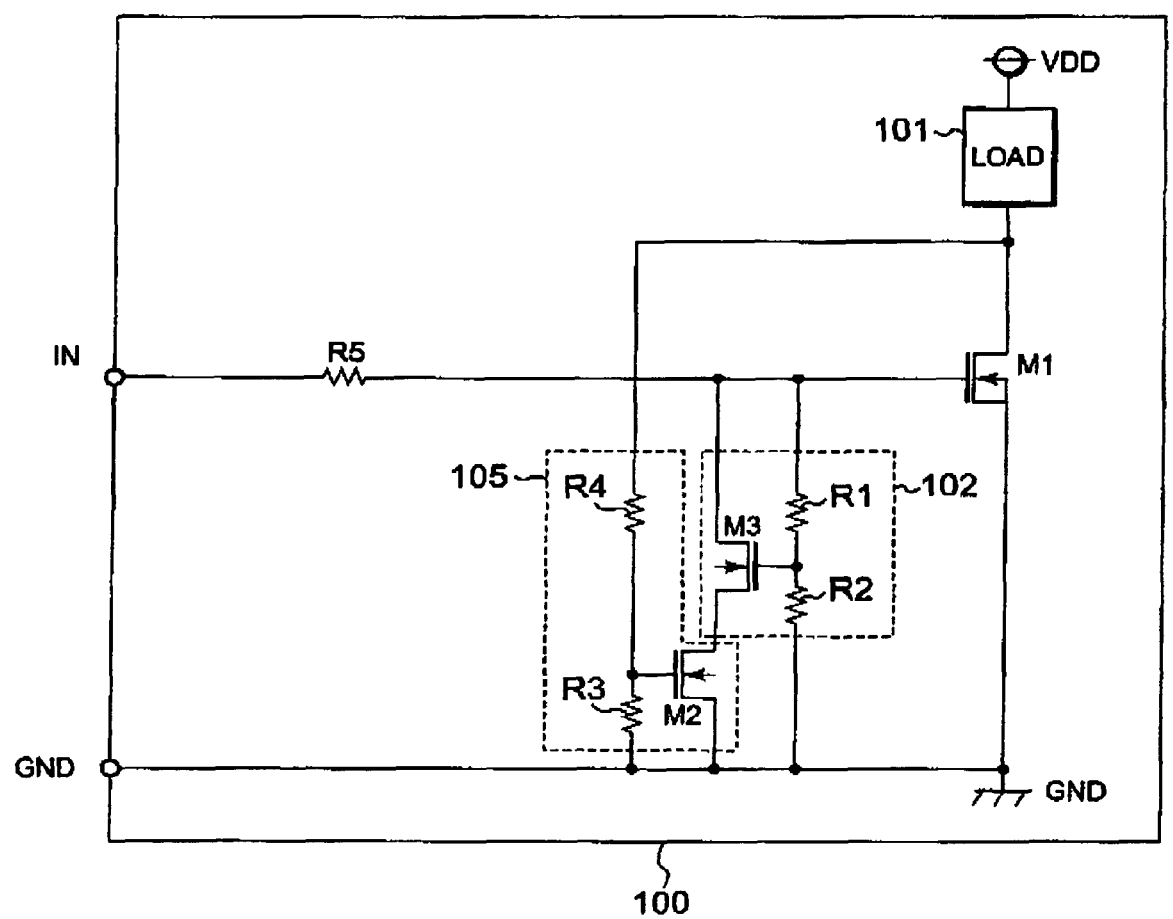
FIG. 3 is a circuit diagram of a semiconductor integrated circuit device of a related art.

FIG. 1 is a circuit diagram of a semiconductor integrated circuit device according to the exemplary embodiment of the present invention. In FIG. 1, the same reference numerals as FIG. 3 denote the same objects, and the descriptions thereof will be omitted. The semiconductor integrated circuit device 100a according to the present exemplary embodiment includes an overcurrent limitation circuit 102a into which a diode D1 for compensating temperature is inserted between a resistance element R2 and GND that is a source of the NMOS transistor M2 as illustrated in FIG. 1, in the forward direction with respect to the overcurrent limitation circuit 102 as illustrated in FIG. 3. The diode D1 has a temperature coefficient of about −2 mV/° C. for decreasing voltage in the forward direction, and a temperature compensation function for offsetting about −2 mV/° C. at the temperature coefficient of the threshold value voltage Vt of the NMOS transistor M3.

When the diode D1 is inserted, a gate control voltage Vg of the NMOS transistor M1 when a current is limited can be described by an expression (2) as below. Here, a Vt denotes a threshold value voltage of NMOS transistor M3, an $I_R$ denotes a current value of each current flowing through resistance elements R1 and R2, and the diode D1, an $R_1$ denotes a resistance value of the resistance element R1, an $R_2$ denotes a resistance value of the resistance element R2, a $V_F$ denotes decreasing voltage in the forward direction of the diode D1.

$$Vt = I_R R_2 + V_F$$

$$Vg = I_R (R_1 + R_2) + V_F$$

Thus, $Vg = I_R R_1 + Vt = (Vt - V_F) R_1 / R_2 + Vt$ (2)

In an expression (2), as similarly to the conventional device, defining as Vg=3.4 V, Vt=1.7 V, and $V_F$=0.6 V, $$R_1/R_2 = 1.7/1.1 = 1.55$$

Thus, $Vg = 1.55(Vt - V_F) + Vt$

At 25° C., to Vg=3.4 V
at 150° C., 0.002×(150−25)=0.25 V is decreased, and $$Vg = 3.4 - 0.25 = 3.15 \text{ (V)}$$

Further, at −40° C., 0.002×(25+40)=0.13 V is increased, and $$Vg = 3.4 + 0.13 = 3.53 \text{ (V)}$$

Figure 2A:
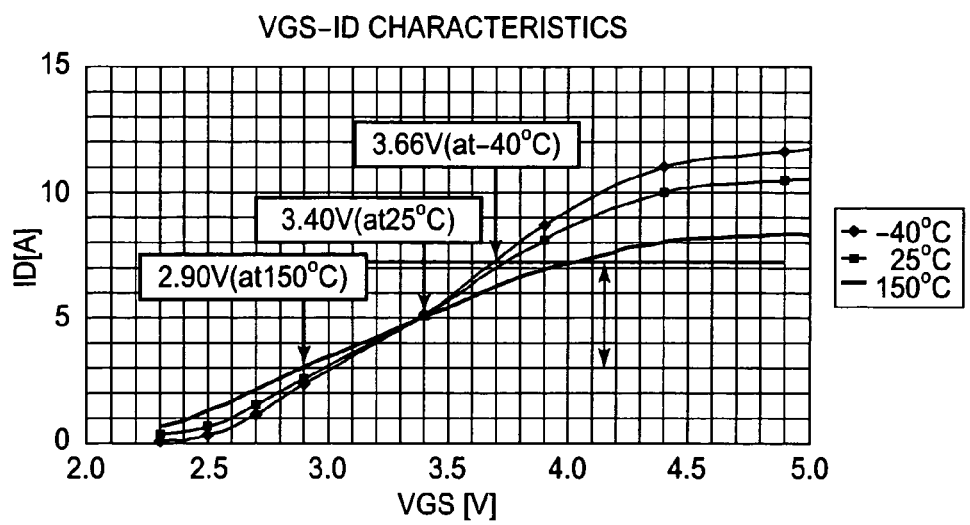
FIG. 2A is a diagram illustrating a temperature dependency of a current limitation value of a conventional output transistor.
Figure 2B:
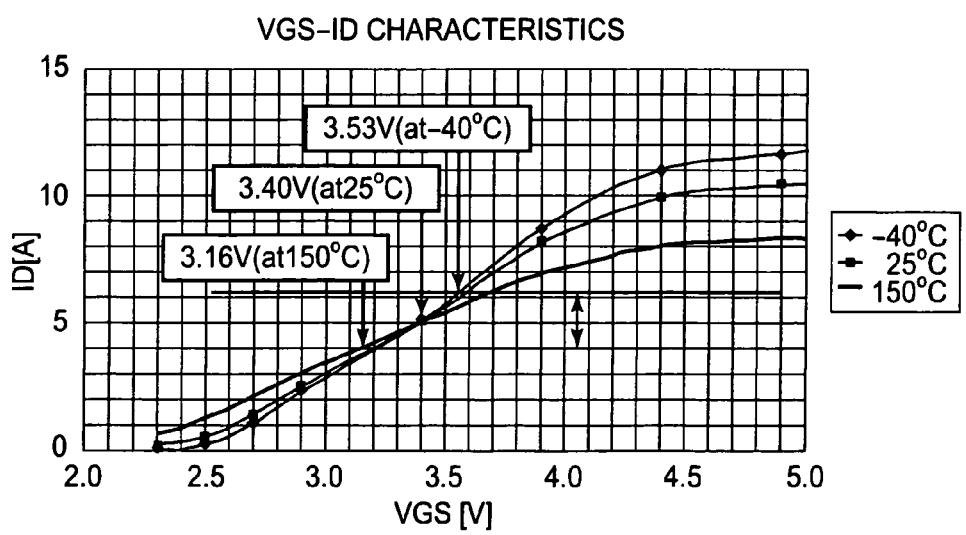
FIG. 2B is a diagram illustrating a temperature dependency of a current limitation value of the output transistor of the exemplary embodiment of the present invention.

To the temperature variation of the gate control voltage Vg of the NMOS transistor M1 as described above, as illustrated in FIG. 2B, from the characteristics of "gate voltage (VGS)-drain current (ID)" of the NMOS transistor, the current limitation value IDlim for the drain current varies about 4.0 to 6.0 A at the temperature range of −40 to 150° C. Thus, compared to the device of the related art, the temperature dependency of the current limitation value can be inhibited.

In FIG. 1, when a place of the resistance element R2 is changed to that of the diode D1, it is needless to say that the device functions similarly.

Referring to the expression (2), since the resistance elements R1 and R2 have different contribution levels to Vt, $V_F$, and Vg owing to resistance ratios of the resistance elements, a plurality of diodes to be inserted between the resistance elements R2 and the GND can be provided in the forward direction such that the temperature dependency can be further improved.

The disclosure of the patent document as described above is incorporated by citing herein. Within a framework of all disclosure (including claims) of the present invention, and further based on the fundamental technological ideas, the exemplary embodiments or the examples can be modified or adjusted. Further, within the framework of the claims of the present invention, a variety of disclosure elements can be combined and selected in various ways. That is, it is needless to say that the present invention can include various modifications and corrections that can be realized by those skilled in the art according to all disclosures and technological ideas including the claims.

Further, it is noted that Applicant's intent is to encompass equivalents of all claim elements, even if amended later during prosecution.

What is claimed is:

1. A semiconductor integrated circuit device, comprising:
a first field effect transistor formed on a main surface of a semiconductor substrate;
an overcurrent detection circuit which detects an overcurrent of the first field effect transistor; and
an overcurrent limitation circuit that is connected between a gate electrode terminal and a source electrode terminal of the first field effect transistor, controls a detected current of the overcurrent detection circuit, and has an output voltage that varies according to a variation of a threshold voltage of the first field effect transistor,
wherein the overcurrent detection circuit comprises:
a third resistance element and a fourth resistance element that detect the overcurrent of the first field effect transistor, and are connected to each other in series; and
a second field effect transistor whose gate electrode is connected to a connection point between the third resistance element and the fourth resistance element,
wherein the overcurrent limitation circuit comprises:
a first resistance element and a series circuit that are connected between the gate electrode terminal and the source electrode terminal of the first field effect transistor, and are connected to each other in series; and
a third field effect transistor whose gate electrode is connected to a connection point between the first resistance element and the series circuit, and that is cascade connected to the second field effect transistor between the gate electrode terminal and the source electrode terminal of the first field effect transistor, and
wherein the series circuit includes a second resistance element and "N" diode(s) ("N" is an integer of one or more) that is to be in a forward direction connected in a series form, the diode(s) is(are) arranged to compensate a temperature dependency of the third field effect transistor.

2. The semiconductor integrated circuit device according to claim 1, wherein "N" is 1.

3. The semiconductor integrated circuit device according to claim 2,
wherein the first field effect transistor and the second and third field effect transistors comprise n-type field effect transistors, and
wherein one end of the second resistance element is connected to the gate electrode of the third field effect transistor, another end thereof is connected to an anode of the diode, and a cathode of the diode is connected to a source electrode of the second field effect transistor.

4. A semiconductor integrated circuit device, comprising:
a first transistor coupled between a first node and a second node, for driving a load element coupled to the first node;
second and third transistors coupled in series between a control gate of the first transistor and the second node;
a first resistor, a second resistor and a diode coupled in series between the control gate of the first transistor and the second node, a connecting point of the first and second resistors being coupled to a control gate of the third transistor; and
third and fourth resistors coupled in series between the first and second nodes, a connecting point of the third and fourth resistors being coupled to a control gate of the second transistor,
wherein the diode is arranged to compensate a temperature dependency of the third transistor.

5. The semiconductor integrated circuit device, as claimed in claim 4,
wherein the first resistor, the second resistor and the diode are arranged in that order from the control gate of the first transistor, and
wherein the third transistor and second transistor are arranged in that order from the control gate of the first transistor.

6. The semiconductor integrated circuit device, as claimed in claim 4,
wherein first resistor, the diode and the second resistor are arranged in that order from the control gate of the first transistor, and
wherein the third transistor and second transistor are arranged in that order from the control gate of the first transistor.

7. The semiconductor integrated circuit device, as claimed in claim 4,
wherein the diode comprises a plurality of diodes that are to be in a forward direction connected in a series form.

* * * * *